(12) United States Patent
Elvira Villagra et al.

(10) Patent No.: US 8,107,288 B2
(45) Date of Patent: Jan. 31, 2012

(54) STATIC MEMORY DEVICES

(75) Inventors: Luis Elvira Villagra, Maastrich (NL);
Rinze L. M. Meijer, Herkenbosch (NL);
Jose De Jesus Pineda De Gyvez,
Eindhoven (NL)

(73) Assignee: NXP B.V., Eindhoven (NL)

( * ) Notice: Subject to any disclaimer, the term of this patent is extended or adjusted under 35 U.S.C. 154(b) by 147 days.

(21) Appl. No.: 12/666,819

(22) PCT Filed: Jun. 25, 2008

(86) PCT No.: PCT/IB2008/052544
§ 371 (c)(1),
(2), (4) Date: Dec. 28, 2009

(87) PCT Pub. No.: WO2009/004535
PCT Pub. Date: Jan. 8, 2009

(65) Prior Publication Data
US 2010/0202192 A1  Aug. 12, 2010

(30) Foreign Application Priority Data
Jun. 29, 2007 (EP) .................................. 07111407

(51) Int. Cl.
*G11C 16/04* (2006.01)

(52) U.S. Cl. .................................. 365/185.05; 365/227
(58) Field of Classification Search ............ 365/185.05, 365/227
See application file for complete search history.

(56) References Cited

U.S. PATENT DOCUMENTS

| | | | | |
|---|---|---|---|---|
| 5,280,454 A * | 1/1994 | Tanaka et al. | ............ | 365/185.17 |
| 5,818,761 A * | 10/1998 | Onakado et al. | ......... | 365/185.18 |
| 7,733,700 B2 * | 6/2010 | Wang | ........................ | 365/185.18 |
| 2001/0038552 A1 | 11/2001 | Ishimaru | | |
| 2003/0076705 A1 | 4/2003 | Yamaoka et al. | | |
| 2005/0068824 A1 | 3/2005 | Houmura et al. | | |
| 2006/0023520 A1 | 2/2006 | Mori et al. | | |
| 2006/0133161 A1 | 6/2006 | Jacquet et al. | | |
| 2007/0076467 A1 | 4/2007 | Yamaoka et al. | | |
| 2007/0091682 A1 * | 4/2007 | Kang et al. | ............... | 365/185.17 |
| 2011/0110160 A1 * | 5/2011 | Wu et al. | .................. | 365/185.18 |

* cited by examiner

*Primary Examiner* — Tuan T. Nguyen

(57) ABSTRACT

A semiconductor memory device includes n-wells (22) and p-wells (24) used to make up a plurality of memory cell elements (40). The n-wells (22) and p-5 wells (24) can be back-biased to improve reading and writing performance. One of the n-wells and p-wells can be globally biased while the other one of the n-wells and p-wells can be biased by groups, such as blocks, rows or columns. Error reduction and/or correction can be performed by adjusting the well bias.

18 Claims, 15 Drawing Sheets

| Sum of MAX_READ1 | VNWELL1 | | | | | | | | | | | | | | | | | | |
|---|---|---|---|---|---|---|---|---|---|---|---|---|---|---|---|---|---|---|---|
| VPWELL | | 0.2 | 0.3 | 0.4 | 0.5 | 0.6 | 0.7 | 0.8 | 0.9 | 1 | 1.1 | 1.2 | 1.3 | 1.4 | 1.5 | 1.6 | 1.7 | 1.8 | 1.9 |
| -1.2 | | 1308 | 3140 | 5412 | 7989 | 9968 | 11168 | 12963 | 13026 | 14323 | 15904 | 16963 | 16508 | 16802 | 17279 | 16303 | 16771 | 19780 | 22056 |
| -1.1 | | 688 | 1549 | 2926 | 4612 | 5891 | 7016 | 7889 | 8204 | 8942 | 10509 | 11550 | 11140 | 12661 | 14354 | 14154 | 14017 | 17164 | 19500 |
| -1 | | 232 | 813 | 1579 | 2552 | 3483 | 3912 | 4471 | 4973 | 5495 | 6560 | 7157 | 7585 | 9588 | 11062 | 12611 | 12094 | 15296 | 17805 |
| -0.9 | | 72 | 300 | 696 | 1189 | 1732 | 2024 | 2651 | 2789 | 2829 | 2870 | 3951 | 4996 | 6691 | 8212 | 9182 | 10886 | 13184 | 16531 |
| -0.8 | | 7 | 67 | 238 | 440 | 705 | 960 | 1186 | 1381 | 1423 | 1443 | 2079 | 2864 | 4034 | 5977 | 7679 | 8778 | 10211 | 14928 |
| -0.7 | | 0 | 9 | 43 | 155 | 240 | 314 | 419 | 474 | 559 | 751 | 993 | 1934 | 2858 | 4676 | 6194 | 8008 | 9967 | 12373 |
| -0.6 | | 0 | 0 | 3 | 10 | 64 | 73 | 96 | 152 | 161 | 217 | 369 | 1031 | 1873 | 2981 | 4761 | 6202 | 7699 | 10669 |
| -0.5 | | 0 | 0 | 0 | 0 | 2 | 13 | 10 | 17 | 30 | 87 | 207 | 584 | 1345 | 2737 | 4004 | 5536 | 6491 | 9327 |
| -0.4 | | 0 | 0 | 0 | 0 | 0 | 0 | 0 | 0 | 14 | 37 | 76 | 368 | 1201 | 1887 | 3249 | 4784 | 6500 | 8631 |
| -0.3 | | 0 | 0 | 0 | 0 | 0 | 0 | 0 | 1 | 0 | 20 | 35 | 217 | 909 | 1616 | 2890 | 4629 | 6107 | 7872 |
| -0.2 | | 0 | 0 | 0 | 0 | 0 | 0 | 1 | 1 | 5 | 9 | 30 | 188 | 801 | 1381 | 2483 | 4209 | 5424 | 7320 |
| -0.1 | | 0 | 0 | 0 | 0 | 0 | 1 | 1 | 1 | 1 | 11 | 38 | 114 | 662 | 1192 | 2119 | 3762 | 5415 | 6935 |
| 0 | | 0 | 0 | 0 | 0 | 1 | 1 | 2 | 2 | 2 | 4 | 17 | 99 | 371 | 1001 | 2031 | 3699 | 5528 | 7169 |
| 0.1 | | 0 | 0 | 0 | 1 | 2 | 2 | 2 | 2 | 3 | 7 | 18 | 86 | 375 | 961 | 1621 | 3413 | 4376 | 6972 |
| 0.2 | | 0 | 0 | 0 | 1 | 2 | 2 | 2 | 2 | 2 | 12 | 13 | 59 | 282 | 630 | 1312 | 2814 | 4146 | 6692 |
| 0.3 | | 0 | 0 | 1 | 2 | 2 | 2 | 2 | 2 | 3 | 5 | 15 | 41 | 225 | 650 | 1139 | 2068 | 3889 | 5886 |
| 0.4 | | 0 | 0 | 1 | 2 | 2 | 2 | 2 | 4 | 17 | 20 | 19 | 24 | 105 | 407 | 1030 | 1603 | 3034 | 4834 |
| 0.5 | | 0 | 2 | 2 | 5 | 9 | 6 | 10 | 7 | 9 | 5 | 7 | 27 | 125 | 360 | 820 | 1427 | 2447 | 3934 |
| | | | | | | | | | | | 6 | 7 | | | | | | | |

Fig 16

| Sum of MAX_READ1 | VNWELL1 | | | | | | | | | | | | | | |
|---|---|---|---|---|---|---|---|---|---|---|---|---|---|---|---|
| VPWELL | 0.3 | 0.4 | 0.5 | 0.6 | 0.7 | 0.8 | 0.9 | 1 | 1.1 | 1.2 | 1.3 | 1.4 | 1.5 | 1.6 |
| -1.2 | 2416 | 2699 | 3451 | 4078 | 4883 | 4975 | 5480 | 5595 | 5003 | 5335 | 5039 | 4845 | 4190 | 3850 |
| -1.1 | 1398 | 1866 | 2010 | 2227 | 2397 | 2658 | 2656 | 2602 | 2593 | 2550 | 2245 | 2280 | 1851 | 1833 |
| -1 | 492 | 908 | 1288 | 1481 | 1512 | 1624 | 1591 | 1619 | 1508 | 1467 | 1398 | 1318 | 1226 | 1024 |
| -0.9 | 240 | 255 | 292 | 380 | 424 | 499 | 582 | 496 | 518 | 423 | 360 | 393 | 275 | 275 |
| -0.8 | 84 | 97 | 98 | 116 | 149 | 132 | 140 | 126 | 118 | 100 | 113 | 109 | 105 | 90 |
| -0.7 | 18 | 32 | 34 | 40 | 43 | 46 | 43 | 41 | 43 | 33 | 31 | 25 | 29 | 30 |
| -0.6 | 5 | 10 | 12 | 16 | 21 | 21 | 18 | 21 | 16 | 13 | 12 | 12 | 14 | 15 |
| -0.5 | 0 | 0 | 0 | 0 | 0 | 1 | 0 | 0 | 0 | 0 | 0 | 0 | 0 | 0 |
| -0.4 | 0 | 0 | 0 | 0 | 0 | 0 | 0 | 0 | 0 | 0 | 0 | 0 | 0 | 0 |
| -0.3 | 0 | 0 | 0 | 0 | 0 | 0 | 0 | 0 | 0 | 0 | 0 | 0 | 0 | 0 |
| -0.2 | 0 | 0 | 0 | 0 | 0 | 0 | 0 | 0 | 0 | 0 | 0 | 0 | 0 | 0 |
| -0.1 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0.1 | 0 | 0 | 0 | 0 | 1 | 1 | 1 | 1 | 1 | 1 | 1 | 1 | 1 | 1 |
| 0.2 | 0 | 0 | 0 | 0 | 0 | 1 | 1 | 1 | 1 | 1 | 1 | 1 | 1 | 1 |
| 0.3 | 0 | 0 | 0 | 0 | 0 | 1 | 3 | 2 | 2 | 2 | 2 | 2 | 2 | 2 |
| 0.4 | 0 | 0 | 0 | 0 | 0 | 1 | 3 | 2 | 2 | 2 | 3 | 3 | 3 | 3 |
| 0.5 | 0 | 0 | 0 | 0 | 1 | 1 | 3 | 2 | 4 | 5 | 6 | 5 | 3 | 3 |

Fig 17

| Sum of MAX_WRITE0 | VNWELL.1 | | | | | | | | | | | | | | | | | |
|---|---|---|---|---|---|---|---|---|---|---|---|---|---|---|---|---|---|---|
| VPWELL | 0.4 | 0.5 | 0.6 | 0.7 | 0.8 | 0.9 | 1 | 1.1 | 1.2 | 1.3 | 1.4 | 1.5 | 1.6 | 1.7 | 1.8 | 1.9 | 2 | 2.1 |
| -1.2 | 4557 | 5293 | 6061 | 6513 | 6584 | 7439 | 8235 | 10038 | 10767 | 10900 | 11351 | 12089 | 12276 | 11833 | 11783 | 11635 | 11725 | 11399 |
| -1.1 | 3369 | 3138 | 3084 | 3199 | 3772 | 3835 | 5187 | 5281 | 5412 | 5491 | 5484 | 5500 | 5516 | 5727 | 5800 | 6285 | 5996 | 5766 |
| -1 | 2534 | 2555 | 2632 | 2658 | 2729 | 2776 | 2819 | 2845 | 2928 | 2974 | 2986 | 3019 | 3087 | 3109 | 3123 | 3179 | 3275 | 3151 |
| -0.9 | 545 | 441 | 485 | 531 | 469 | 621 | 992 | 1155 | 953 | 1248 | 1061 | 1791 | 947 | 1069 | 1048 | 1051 | 968 | 774 |
| -0.8 | 243 | 103 | 77 | 72 | 105 | 119 | 138 | 139 | 154 | 174 | 183 | 205 | 215 | 196 | 191 | 214 | 182 | 190 |
| -0.7 | 121 | 32 | 13 | 33 | 19 | 41 | 43 | 47 | 56 | 48 | 63 | 64 | 62 | 65 | 62 | 63 | 59 | 65 |
| -0.6 | 79 | 13 | 3 | 1 | 0 | 0 | 0 | 0 | 0 | 0 | 1 | 0 | 0 | 0 | 1 | 5 | 0 | 0 |
| -0.5 | 47 | 8 | 1 | 0 | 0 | 0 | 0 | 0 | 0 | 0 | 0 | 0 | 0 | 0 | 0 | 0 | 0 | 0 |
| -0.4 | 21 | 2 | 1 | 0 | 0 | 0 | 0 | 0 | 0 | 0 | 0 | 0 | 0 | 0 | 0 | 0 | 0 | 0 |
| -0.3 | 13 | 1 | 0 | 0 | 0 | 0 | 0 | 0 | 0 | 0 | 0 | 0 | 0 | 0 | 0 | 0 | 0 | 0 |
| -0.2 | 2 | 1 | 0 | 0 | 0 | 0 | 0 | 0 | 0 | 0 | 0 | 0 | 0 | 0 | 0 | 0 | 0 | 0 |
| -0.1 | 2 | 0 | 0 | 0 | 0 | 0 | 0 | 0 | 0 | 0 | 0 | 0 | 0 | 0 | 0 | 0 | 0 | 0 |
| 0 | 2 | 0 | 0 | 0 | 0 | 0 | 0 | 0 | 0 | 0 | 0 | 0 | 0 | 0 | 0 | 0 | 0 | 0 |
| 0.1 | 0 | 0 | 0 | 0 | 0 | 0 | 0 | 0 | 0 | 0 | 0 | 0 | 0 | 0 | 0 | 0 | 0 | 0 |
| 0.2 | 0 | 0 | 0 | 0 | 0 | 0 | 0 | 0 | 0 | 0 | 0 | 0 | 0 | 0 | 0 | 0 | 0 | 0 |
| 0.3 | 1 | 0 | 0 | 0 | 0 | 0 | 0 | 0 | 0 | 0 | 0 | 0 | 0 | 0 | 0 | 0 | 0 | 0 |
| 0.4 | 8 | 2 | 1 | 0 | 0 | 0 | 0 | 0 | 1 | 0 | 0 | 0 | 0 | 0 | 0 | 0 | 0 | 0 |
| 0.5 | 17 | 9 | 3 | 1 | 0 | 0 | 0 | 0 | 0 | 0 | 0 | 1 | 0 | 0 | 0 | 1 | 0 | 0 |
|  | 8 | 3 | 0 | 0 | 0 | 0 | 0 | 0 | 0 | 0 | 0 | 0 | 0 | 0 | 0 | 0 | 0 | 0 |

Fig 18

| Sum of MAX_WRITE0 | VNWELL1 | | | | | | | | | | | | | | | | | | |
|---|---|---|---|---|---|---|---|---|---|---|---|---|---|---|---|---|---|---|---|
| VPWELL | | 0.5 | 0.6 | 0.7 | 0.8 | 0.9 | 1 | 1.1 | 1.2 | 1.3 | 1.4 | 1.5 | 1.6 | 1.7 | 1.8 | 1.9 | 2 | 2.1 | 2.2 |
| -1.2 | | 5837 | 7744 | 9209 | 10141 | 11660 | 11748 | 12134 | 13478 | 14081 | 14394 | 16115 | 16635 | 16121 | 16088 | 16585 | 17614 | 17281 | 17697 |
| -1.1 | | 3262 | 3250 | 3352 | 3584 | 4098 | 4807 | 5202 | 5925 | 5591 | 5802 | 6666 | 5975 | 7021 | 8414 | 6694 | 7511 | 8877 | 8618 |
| -1 | | 2669 | 2704 | 2770 | 2741 | 2864 | 2915 | 2924 | 3053 | 3062 | 3262 | 3231 | 3356 | 3467 | 3730 | 4140 | 4349 | 4406 | 4688 |
| -0.9 | | 688 | 885 | 1401 | 1711 | 2267 | 2340 | 2503 | 2545 | 2593 | 2629 | 2654 | 2686 | 2691 | 2692 | 2709 | 2744 | 2806 | 2815 |
| -0.8 | | 93 | 100 | 144 | 154 | 278 | 294 | 332 | 283 | 339 | 367 | 357 | 396 | 397 | 388 | 385 | 431 | 421 | 415 |
| -0.7 | | 6 | 2 | 5 | 19 | 32 | 48 | 38 | 64 | 63 | 72 | 64 | 65 | 69 | 65 | 96 | 83 | 99 | 78 |
| -0.6 | | 4 | 0 | 0 | 0 | 0 | 0 | 0 | 0 | 0 | 0 | 3 | 6 | 8 | 4 | 6 | 10 | 18 | 22 |
| -0.5 | | 4 | 0 | 0 | 0 | 0 | 0 | 0 | 0 | 0 | 0 | 0 | 0 | 0 | 0 | 0 | 0 | 0 | 0 |
| -0.4 | | 5 | 0 | 0 | 0 | 0 | 0 | 0 | 0 | 0 | 0 | 0 | 0 | 0 | 0 | 0 | 0 | 0 | 0 |
| -0.3 | | 8 | 1 | 1 | 0 | 0 | 0 | 0 | 0 | 0 | 0 | 0 | 0 | 0 | 0 | 0 | 0 | 0 | 0 |
| -0.2 | | 10 | 6 | 2 | 1 | 1 | 1 | 0 | 0 | 0 | 0 | 0 | 0 | 0 | 0 | 0 | 0 | 0 | 0 |
| -0.1 | | 51 | 19 | 7 | 6 | 4 | 1 | 1 | 1 | 1 | 1 | 1 | 1 | 0 | 0 | 0 | 0 | 0 | 0 |
| 0 | | 203 | 89 | 44 | 27 | 8 | 5 | 4 | 3 | 2 | 6 | 3 | 2 | 1 | 1 | 1 | 0 | 0 | 0 |
| 0.1 | | 748 | 484 | 212 | 106 | 68 | 49 | 19 | 13 | 7 | 28 | 16 | 8 | 7 | 4 | 2 | 1 | 1 | 1 |
| 0.2 | | 2712 | 1599 | 851 | 569 | 300 | 235 | 128 | 59 | 35 | 131 | 121 | 60 | 41 | 29 | 14 | 9 | 7 | 3 |
| 0.3 | | 8797 | 4844 | 3498 | 1788 | 1303 | 776 | 483 | 349 | 197 | 609 | 489 | 343 | 192 | 123 | 76 | 59 | 25 | 18 |
| 0.4 | | 23140 | 14166 | 8896 | 6350 | 4063 | 2715 | 1787 | 1372 | 996 | 791 | 572 | 448 | 254 | 208 | 121 | 71 | 40 | 16 |
| 0.5 | | 27851 | 19753 | 12834 | 8577 | 5893 | 4021 | 2980 | 1990 | 1437 | | | | | | | | 9 | 5 |

Fig 19

| Sum of ERRORS | VNWELL2 | | | | | | | | | | | | |
|---|---|---|---|---|---|---|---|---|---|---|---|---|---|
| VPWELL | 0.2 | 0.3 | 0.4 | 0.5 | 0.6 | 0.7 | 0.8 | 0.9 | 1 | 1.1 | | | |
| -1.2 | 454536 | 333475 | 318557 | 347305 | 375630 | 409157 | 434811 | 457049 | 471403 | 480059 | | | |
| -1.1 | 414723 | 254139 | 212361 | 216322 | 233546 | 259331 | 287804 | 302495 | 311245 | 315481 | | | |
| -1 | 344983 | 195452 | 142850 | 132450 | 135530 | 143752 | 154300 | 162095 | 167945 | 174564 | | | |
| -0.9 | 264913 | 145596 | 105045 | 90783 | 88551 | 90711 | 94529 | 96281 | 97875 | 101554 | | | |
| -0.8 | 192840 | 98795 | 67789 | 56272 | 59371 | 62413 | 65646 | 65980 | 66401 | 67299 | | | |
| -0.7 | 142554 | 70393 | 45518 | 38165 | 36498 | 35855 | 36190 | 36702 | 36448 | 37197 | | | |
| -0.6 | 102649 | 49132 | 31871 | 28259 | 29208 | 31564 | 33089 | 33533 | 33519 | 33512 | | | |
| -0.5 | 70033 | 34746 | 22592 | 19459 | 20677 | 23780 | 27768 | 31511 | 32874 | 32924 | | | |
| -0.4 | 47982 | 26569 | 19434 | 17337 | 16826 | 17369 | 20215 | 24867 | 30300 | 32692 | | | |
| -0.3 | 33273 | 21307 | 17722 | 16777 | 16524 | 16453 | 16563 | 18351 | 24003 | 30274 | | | |
| -0.2 | 23608 | 18180 | 16812 | 16522 | 16452 | 16420 | 16403 | 16452 | 18060 | 24154 | | | |
| -0.1 | 13781 | 12414 | 13634 | 15347 | 16184 | 16387 | 16393 | 16386 | 16438 | 18609 | | | |
| 0 | 1565 | 1758 | 3813 | 6950 | 11550 | 14890 | 16297 | 16385 | 16386 | 16433 | | | |
| 0.1 | 592 | 144 | 162 | 1244 | 4784 | 10335 | 14450 | 16335 | 16387 | 16391 | | | |
| 0.1 | 602 | 136 | 91 | 482 | 2735 | 9028 | 13888 | 16253 | 16387 | 16389 | | | |
| 0.2 | 311 | 76 | 11 | 5 | 145 | 2801 | 15401 | 27839 | 32683 | 32774 | | | |
| 0.3 | 95 | 16 | 0 | 0 | 0 | 8 | 986 | 14495 | 28726 | 32769 | | | |
| 0.4 | 23 | 0 | 0 | 0 | 0 | 0 | 8 | 1252 | 17582 | 31208 | | | |
| 0.5 | 2 | 0 | 0 | 0 | 0 | 3 | 8 | 365 | 12833 | 29716 | | | |
| 0.6 | 3 | 0 | 0 | 0 | 3 | 8 | 19 | 2647 | 22718 | 32676 | | | |

Fig 20

| Sum of ERRORS | VNWELL2 | | | | | | | | | | | | | | |
|---|---|---|---|---|---|---|---|---|---|---|---|---|---|---|---|
| VPWELL | 0.2 | 0.3 | 0.4 | 0.5 | 0.6 | 0.7 | 0.8 | 0.9 | 1 | 1.1 | 1.2 | 1.3 | 1.4 | 1.5 |
| -1.2 | 287363 | 98812 | 26553 | 8712 | 3588 | 1691 | 1220 | 1466 | 2276 | 3840 | 6395 | 10918 | 16862 | 21593 |
| -1.1 | 285223 | 86924 | 22677 | 7153 | 2914 | 1270 | 697 | 625 | 866 | 1677 | 3082 | 6055 | 10621 | 15932 |
| -1 | 248926 | 71652 | 18156 | 5388 | 2082 | 973 | 481 | 251 | 262 | 504 | 1209 | 2796 | 5532 | 9947 |
| -0.9 | 209937 | 57887 | 14485 | 4097 | 1567 | 658 | 338 | 157 | 80 | 128 | 377 | 1171 | 2926 | 6227 |
| -0.8 | 171508 | 45896 | 11067 | 3074 | 1128 | 446 | 179 | 94 | 52 | 41 | 114 | 457 | 1502 | 3554 |
| -0.7 | 135154 | 35059 | 8168 | 2219 | 715 | 329 | 129 | 48 | 22 | 25 | 38 | 162 | 650 | 1958 |
| -0.6 | 102300 | 25882 | 5811 | 1482 | 458 | 196 | 83 | 31 | 21 | 14 | 21 | 114 | 405 | 1268 |
| -0.5 | 73347 | 18259 | 3838 | 958 | 317 | 121 | 46 | 21 | 16 | 10 | 11 | 54 | 311 | 1011 |
| -0.4 | 50165 | 12123 | 2440 | 512 | 179 | 68 | 28 | 16 | 7 | 7 | 2 | 21 | 203 | 710 |
| -0.3 | 31311 | 7321 | 1448 | 257 | 89 | 46 | 14 | 6 | 6 | 1 | 3 | 22 | 154 | 724 |
| -0.2 | 18058 | 3927 | 715 | 153 | 53 | 25 | 11 | 6 | 1 | 0 | 2 | 16 | 134 | 620 |
| -0.1 | 9462 | 2009 | 257 | 65 | 30 | 11 | 0 | 0 | 0 | 0 | 2 | 24 | 133 | 606 |
| 0 | 4056 | 959 | 161 | 48 | 11 | 5 | 0 | 0 | 0 | 0 | 1 | 16 | 141 | 625 |
| 0.1 | 1588 | 268 | 45 | 17 | 0 | 0 | 0 | 0 | 0 | 0 | 1 | 29 | 109 | 566 |
| 0.1 | 1850 | 338 | 54 | 16 | 0 | 0 | 0 | 0 | 0 | 0 | 3 | 15 | 144 | 583 |
| 0.2 | 1129 | 153 | 45 | 0 | 0 | 0 | 0 | 0 | 3 | 0 | 3 | 29 | 220 | 1165 |
| 0.3 | 209 | 44 | 0 | 0 | 0 | 0 | 3 | 3 | 6 | 8 | 0 | 24 | 180 | 919 |
| 0.4 | 29 | 0 | 0 | 0 | 0 | 0 | 6 | 10 | 19 | 20 | 6 | 28 | 120 | 630 |
| 0.5 | 0 | 0 | 0 | 0 | 6 | 9 | 22 | 34 | 35 | 40 | 24 | 50 | 188 | 907 |
| | 0 | 0 | 0 | 0 | | | | | | | 48 | 77 | 400 | 2232 |

Fig 21

STATIC MEMORY DEVICES

The invention relates to static memory devices and a method of operating the memory devices.

FIG. 1 illustrates the layout of a memory device. A cell matrix 2 has a number of memory elements 4 laid out in rows and columns. Bit lines 6 follow the columns and word lines 8 follow the rows. A row decoder 10 drives the word lines and a column decoder 12 selects the appropriate bit lines and passes the signal to sense amplifiers 14 and then to buffers and input output drivers 16.

In more modern memories, the cell matrix 2 is divided into blocks 18, as illustrated in FIG. 2. This allows blocks 18 to be activated individually which can lower power consumption and robustness. Block decoder 20 selects the required block.

FIG. 3 illustrates in more detail a cell matrix. The memory elements are CMOS, made up of both n-type and p-type devices which are provided using both n-wells 22 and p-wells 24. The n-wells 22 and p-wells 24 extend in the column direction. Both global and local word lines and bit lines are used, the local word lines extending only in a local region and being connected to global word lines.

The rows include cell rows 26 which include the memory cells and other rows which have a number of other functions, including multiplexer (MUX) rows 27 and strap rows 28. The local bit lines extend in the column direction from a strap row 28 to the next MUX row 27 which connects the local bit lines to the global bit lines. Both strap and MUX rows 27,28 are used also for properly terminating the bit lines and also for biasing the wells 22,24. The top row is a guard row 25 which terminates the matrix and the bottom row is a match row 29 which also terminates the matrix but which provides the interface to the periphery circuits.

A number of problems can occur in such structures. Weak cells can occur, in which the static noise margin is close to zero and in which therefore the cell state can flip in certain operating conditions. Cells can also have a poor write margin—a write margin close to zero means that the cell may fail to write. As the voltages used in memory circuits continue to decrease these failure types are more likely to occur.

A development of such conventional memory circuits is presented in US2005/0068824 which suggests the biasing of rows of cells separately. The substrates of individual transistors of the rows are biased differently for reading and writing. The way in which the n-wells and p-wells are arranged is not disclosed. It appears that the substrates of the individual transistors of each bit are separated to allow them to be separately biased and this will very significantly and undesirably increase the size of the memory device of US2005/0068824 compared with conventional devices.

According to the invention there is provided a memory device according to claim 1.

By using biasing based on groups of memory cell elements for one of the n-wells and p-wells overhead is significantly reduced compared with US2005/0068824. Biasing for the other of the n-wells and p-wells is done on a more local level, allowing the biasing to be fine tuned.

Further, the reduced capacitance that needs to be charged compared with the whole device allows biasing to occur much faster.

In another aspect, there is provided a method of operation of a memory device according to claim 14.

The method may further include driving the periphery with a periphery drive voltage (VDDP) separately from the memory drive voltage.

The method may include forward biasing the p-well and reverse biassing the n-well.

For a better understanding of the invention, embodiments will now be described, purely by way of example, with reference to the accompanying drawings, in which:

FIGS. 16 to 21 are results of measurements made using the invention.

The drawings are schematic and not to scale. Like or similar components have been given the same reference numerals in different drawings.

The inventors have carried out investigations to determine suitable bias conditions for the transistors of memory cells used, and these will be discussed first. In particular, the inventors focussed on the static noise margin for reading and the write margin for writing. The results with back biasing were compared with a case with $V_{DD}=1.2V$ and no back biasing. The experiments were carried out in particular for a 65 nm process.

Figure 4:
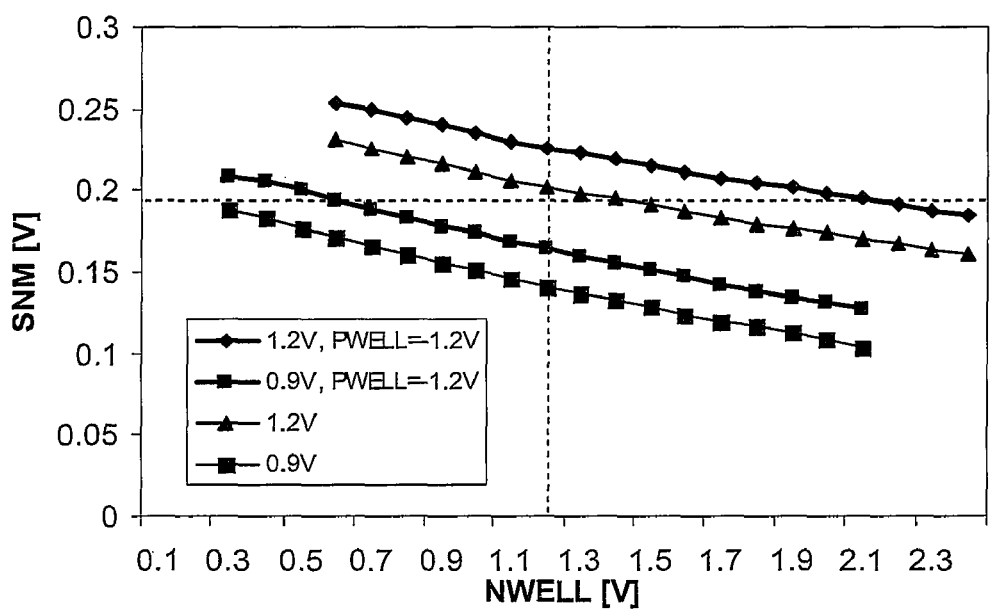
FIGS. 4 to 7 illustrate results achieved with different bias conditions.

Firstly, FIG. 4 illustrates the static noise margin (in volts) at 125° C. at two power voltages $V_{DD}=1.2$ V and $V_{DD}=0.9V$, with and without the p-well bias of −1.2V. The static noise margin with $V_{DD}=1.2$ V and the n-well at the same voltage, that is to say unbiased, is about 0.2V.

If the power voltage $V_{DD}$ is reduced to 0.9V, the static noise margin reduces.

At a power voltage $V_{DD}=0.9V$, a similar static noise margin is obtained as in the unbiased $V_{DD}=1.2$ V case, by using a p-well bias of −1.2V and an n-well bias of 0.6V. Thus, the same static noise margin can be obtained with a 0.9V power voltage and back biasing as with a 1.2V power supply.

Figure 5:
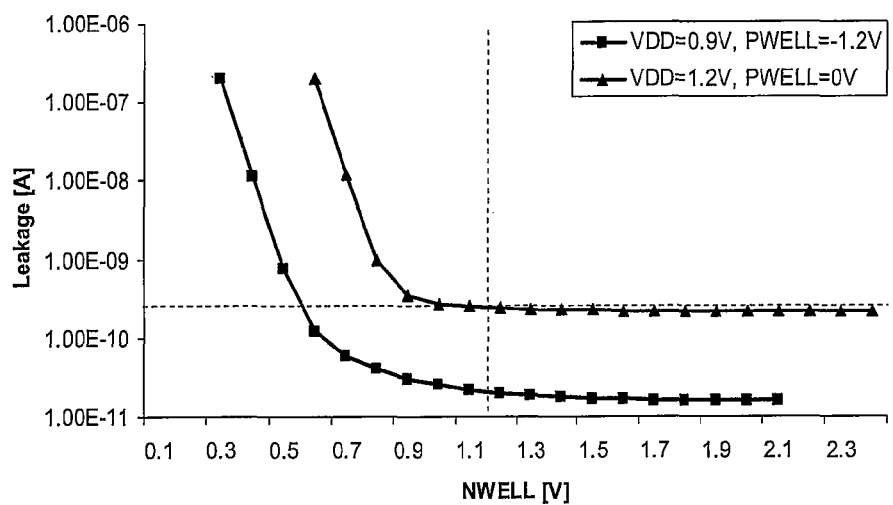

Moreover, the leakage current is also reduced. FIG. 5 shows the leakage current as a function of n-well voltage for two cases, $V_{DD}=1.2$ V without p-well bias and $V_{DD}=0.9V$ with a p-well bias of −1.2V. By choosing to operate at the point with the n-well biased to 0.6V, an improvement in leakage current is obtained.

Figure 6:
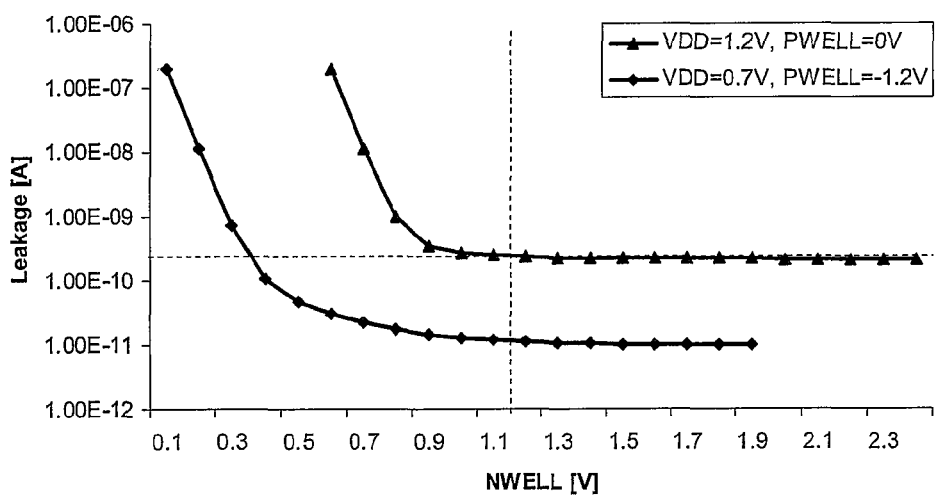

FIG. 6 illustrates further that in a standby mode with $V_{DD}$ of 0.7V, still further reductions in leakage current are possible.

Figure 7:
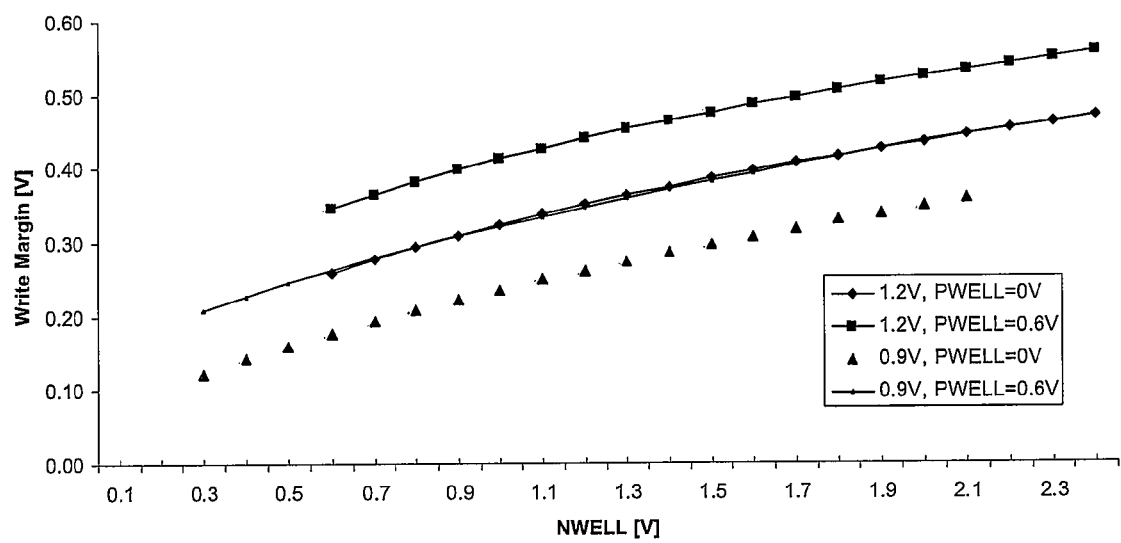

The static noise margin is relevant to reading. For writing, the write margin is more relevant. FIG. 7 illustrates the write margin for the same two power voltages $V_{DD}=1.2$ V and $V_{DD}=0.9V$, with and without a p-well bias of 0.6V. It will be seen that at $V_{DD}=1.2$ V and no biasing (p-well bias 0V, n-well 1.2V) a write margin of 350 mV is obtained.

If the power supply voltage is reduced to $V_{DD}=0.9V$, without biasing, the write margin reduces to 225 mV and this may well be too low for reliable writing.

By biasing the n-well to 2.4V and the p-well to 0.6V, a better write margin is obtained even with a lower power supply voltage of $V_{DD}$=0.9V. Even without the p-well bias, but with an n-well bias of 2.4V and the lower power supply voltage of $V_{DD}$=0.9V, a write margin better than 0.36 V is achievable. A write margin of 308 mV is also achieved at the lower power supply voltage of $V_{DD}$=0.9V with a p-well bias of 0.6V, even without the n-well bias, the n-well accordingly being at 0.9V.

Figure 1:
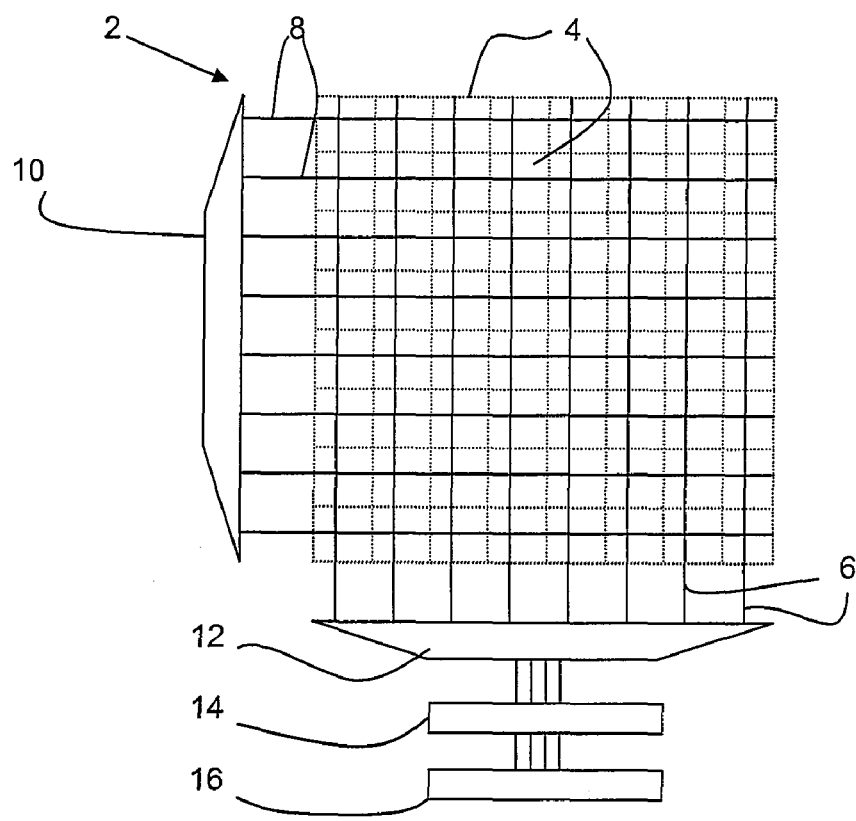
FIG. 1 illustrates a prior art memory cell architecture.
Figure 2:
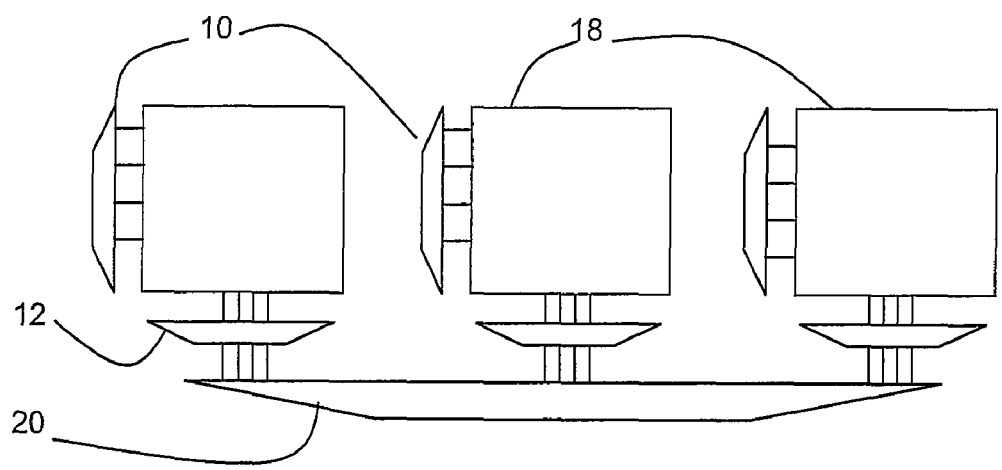
FIG. 2 illustrates a further prior art memory cell architecture.
Figure 3:
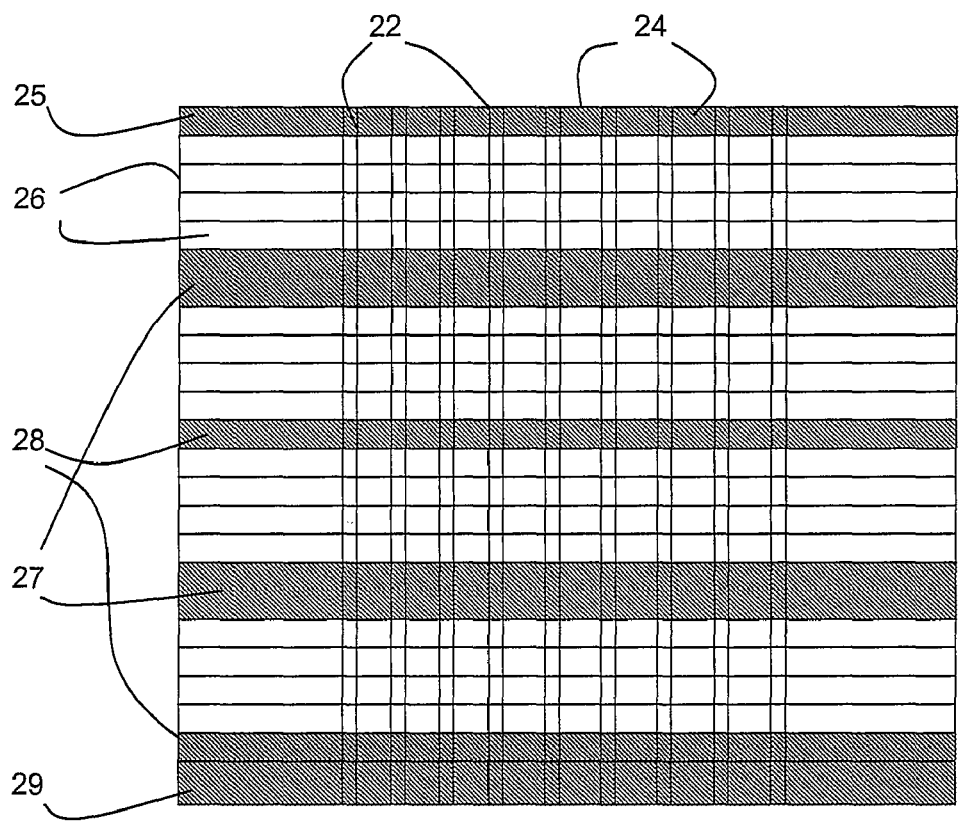
FIG. 3 illustrates the wells used in a prior art memory cell architecture.

Having identified suitable bias conditions, it is then necessary to apply bias to the memory cells in a standard array. Unfortunately, the n-wells and p-wells 22, 24 extending in conventional memory cell architectures do not permit this type biasing by row, since the n-wells 22 and p-wells 24 are connected together in the column direction (see FIG. 3). Thus, it would only be possible to bias the whole array, or at least a block, at the same time, which is not efficient and in particular would require large amounts of current to charge and discharge the well capacitance for the whole array or block. The provision of such currents would be impracticable and time consuming, and would introduce a significant time delay between reading and writing.

In contrast, the arrangement of US2005/0068824 requires providing three separately controllable bias voltages to different pairs of transistors in each memory cell, which is very difficult to provide for. Nor does US2005/0068824 provide any details of suitable bias voltages.

Figure 8:
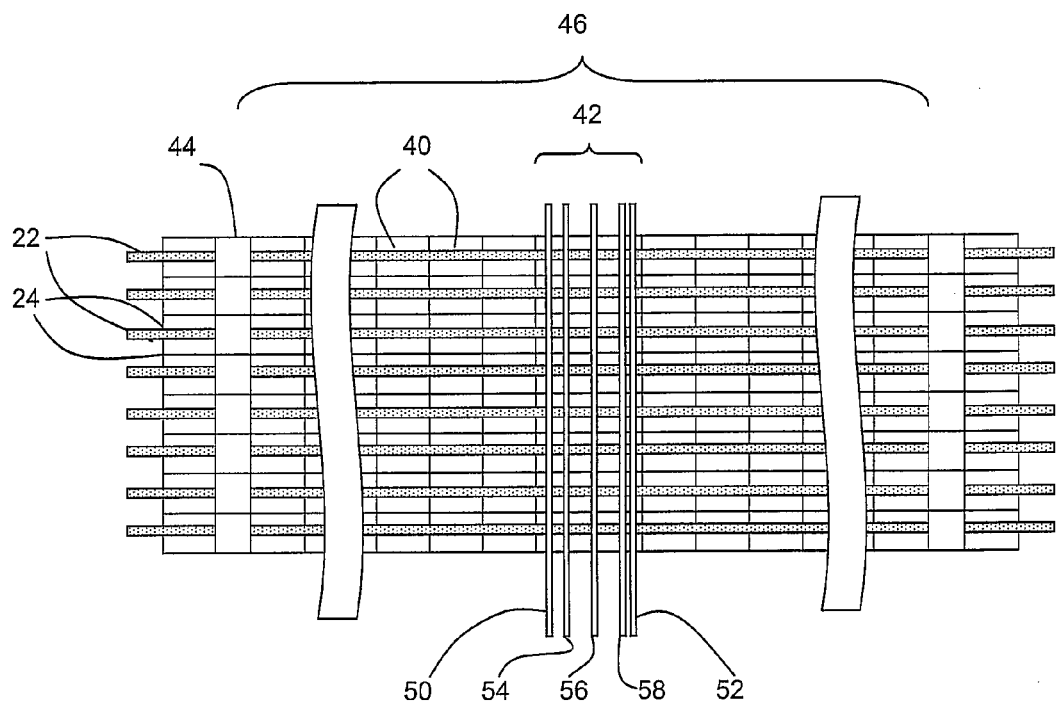
FIGS. 8 to 10 illustrate schematically a first embodiment of the invention.

Referring to FIG. 8, a first embodiment of the invention is implemented using n-wells 22 and p-wells 24 extending in the row direction, essentially alternating. The n-wells 22 are shown dotted.

Each row includes a number of words 46, each in turn made up of a number of bit cells 40. The bit cells can, where desired be grouped together, for example into so-called quadro cells having four bits.

A block select unit 42 is provided in each word 46. This unit selects the required bits. It connects, where required, local word lines used within each word 46 to global wordlines shared by all words in a row.

Split cells 44 are used at the end of the words. It will be noted that in the embodiment the n-wells do not extend through the split cells 44, though the p-wells do.

Although not shown, guard cells are provided at the ends of each row.

A positive power rail ($V_{DD}$) 50 and a negative power rail 52 pass in the column direction over the block select unit.

In this embodiment, the biasing of the cells is done at the level of the word in the block select unit 42, which itself acts as biasing means. Higher positive voltage rail 54, lower positive voltage rail 56 and negative voltage rail 58 pass across the block select unit, in the column direction. These are used to supply 2.4V, 0.6V and −1.2 V respectively. As will be appreciated, similar rails pass across the other words in the same row.

The block select unit 42 connects the n-well 22 and p-well 24 to the rails 54, 56, 58 depending on a read-enable signal applied on read enable signal line 60 and a write enable signal applied on write enable line 62. This may be done using the circuits shown in FIG. 9.

The advantage of the arrangement is that since the selection is done at word level, the capacitance of the well is small and the amount of charge and hence current that needs to be supplied or discharged through the rails 54, 56, 58 is small. This makes it relatively straightforward to deliver the back biasing.

In the embodiment, the block select unit in fact biases a pair of wells, on two adjacent rows, so that the group of cells for which the back biasing is selected is a pair of words, adjacent to one another in the column direction.

The tested embodiments use a $V_{DD}$ of 0.9V (or 1.2V) and a 65 nm process. However, the underlying concept works with different feature sizes and power voltages. Further, the specific bias voltages used of +0.6V, −1.2V and +2.4V can also be varied.

In more general terms, let the power voltage be $V_{DD}$ with reference to a ground voltage GND. Then, a suitable back bias voltage for the p-well is (GND−a$V_{DD}$) where a is in the range $0<a\leq2$, instead of −1.2V in the specific example. A suitable forward bias voltage for the p-well is (GND+0.6V b) where $0<b\leq1$, instead of +0.6V in the specific example.

For the n-well, a suitable back bias voltage is ($V_{DD}$+c $V_{DD}$) where c is in the range $0<c\leq2$, instead of +2.4V in the specific example. A suitable forward bias voltage for the n-well is ($V_{DD}$−0.6V.d) where $0<d\leq1$, instead of +0.6V in the specific example.

Note the constraint is that the forward bias voltage should normally not be more than 0.6V compared with ground for the p-well or $V_{DD}$ for the n-well to avoid dropping more than one diode drop. Leakage increases exponentially for forward bias voltages above this.

Further, note that although in principle there are four voltages it is possible to select d and b so that the forward bias voltage for the p-well is the same as the forward bias voltage to the n-well, for example the choice of 0.6V in the present case, and this reduces the number of separate voltage levels required.

Figure 10:
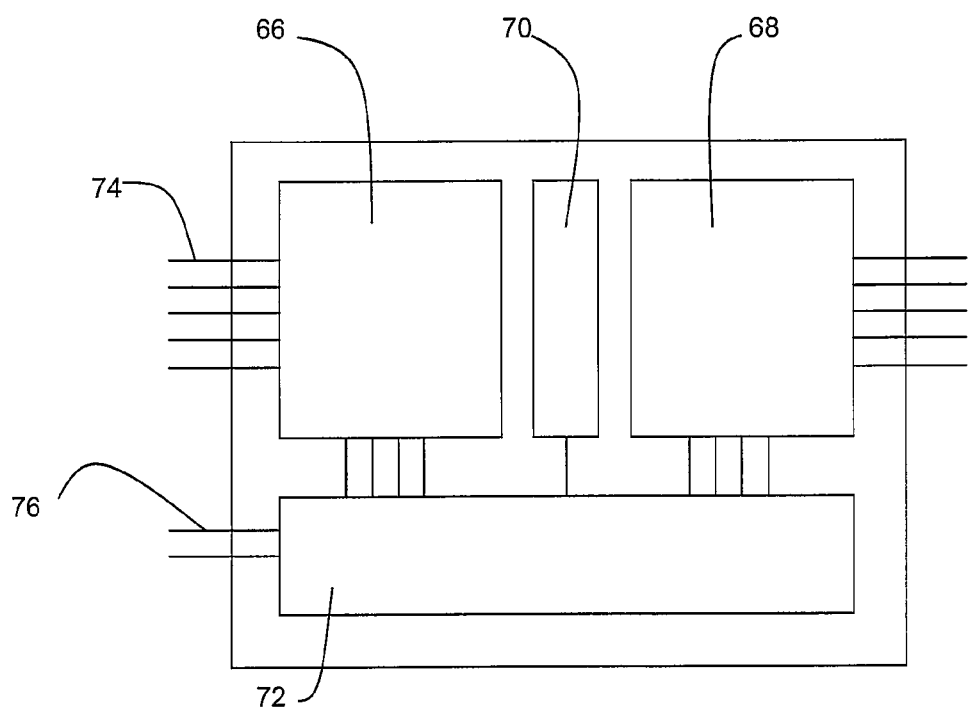

FIG. 10 illustrates the memory on a more macroscopic level. It includes a first block 66, a second block 68 and a central region 70 including x-decoders. Peripheral circuitry 72 is provided connecting to the decoders and the blocks.

The bias values chosen make it possible to operate the memory effectively at lower voltages.

Further, FIG. 10 illustrates a further development, namely the use of separate matrix power supplies 74 for each block 66, 68, and a separate periphery power supply 76. Each matrix power supply 74 includes five voltage lines, corresponding to the five voltage rails in FIG. 8. The periphery power simply includes two lines, the periphery positive drive voltage $V_{DDPeriphery}$, and the ground voltage.

Blocks 66, 68 that are not being used can then be operated at a lower power supply by reducing the voltage supplied by the respective matrix power supply 74.

Note from the results presented above with reference to FIGS. 4 to 7 that the inventors have shown that significant improvements to both write margin and read margin can be obtained by biasing only one of the n-well 22 and p-well 24. Thus, even if only the bias condition for the local wells is achieved significant improvement is made over the prior art. Thus, in embodiments, it is possible to commence reading or writing when only the local wells have reached the correct voltage level and the global well is still charging. Alternatively, in other embodiments it is only the local wells that are biased and the global wells are simply kept at a constant voltage of ground or $V_{DD}$ depending on whether the global well is a p-well or an n-well.

Further, by splitting the matrix and periphery power supplies the periphery can be operated at the circuit logic voltage and the matrix at the optimum voltage for operating the memory, which may be different.

In an alternative approach, variable back biasing is used for the periphery also—in this case, the periphery power supply 76 includes multiple lines.

In an alternative approach, a single matrix power supply 74 supplies power for all blocks in common.

By providing the specific layout set out above, such biasing voltages can be applied to individual groups of bits, i.e. a pair of words in this embodiment, thereby ensuring good biasing for reading and writing. There is no need to bias the whole block which would be both slower in view of the higher capacitance and unnecessary.

In a modification of this approach, a so-called triple well technology is used

Figure 9:
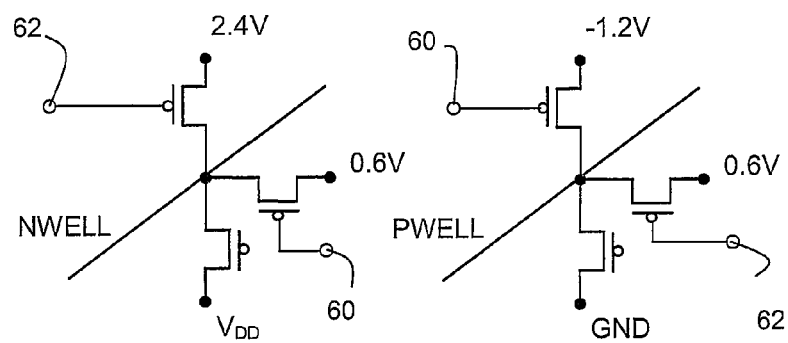
Figure 11:
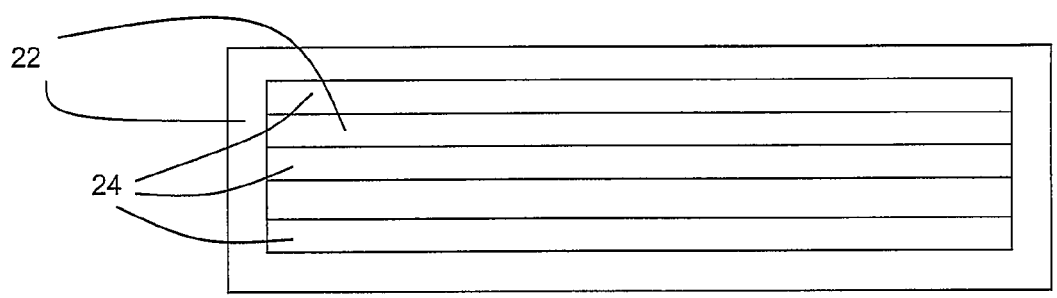
FIG. 11 illustrates schematically a second embodiment of the invention.

FIG. 11 illustrates such an embodiment, a modification of that proposed in FIGS. 8 and 9. In this approach, a triple well technology is used, in which each word has a so-called triple well, with an n-well 22 and three p-wells 24 surrounded by the n-well 22. As in the embodiment of FIGS. 8 to 10, an individual structure as illustrated in FIG. 11 is used for a pair of words adjacent in the column direction. In this approach, it is the p-wells that are broken at the split cells and the n-wells that are connected together.

In a modification of this approach, both the n-well and the p-well are broken at the split cells; this is achievable using triple well technology. This allows individual biasing of both the n-wells and p-wells of a word (or pair of words).

A still further arrangement using triple wells uses the outside well for the whole of each block of memory 66,68 (FIG. 10), and multiple local p-wells in the block which can be locally biased. In this case, the local p-wells need not be restricted to individual words, but may cover more or less of the block depending on layout considerations.

Figure 12:
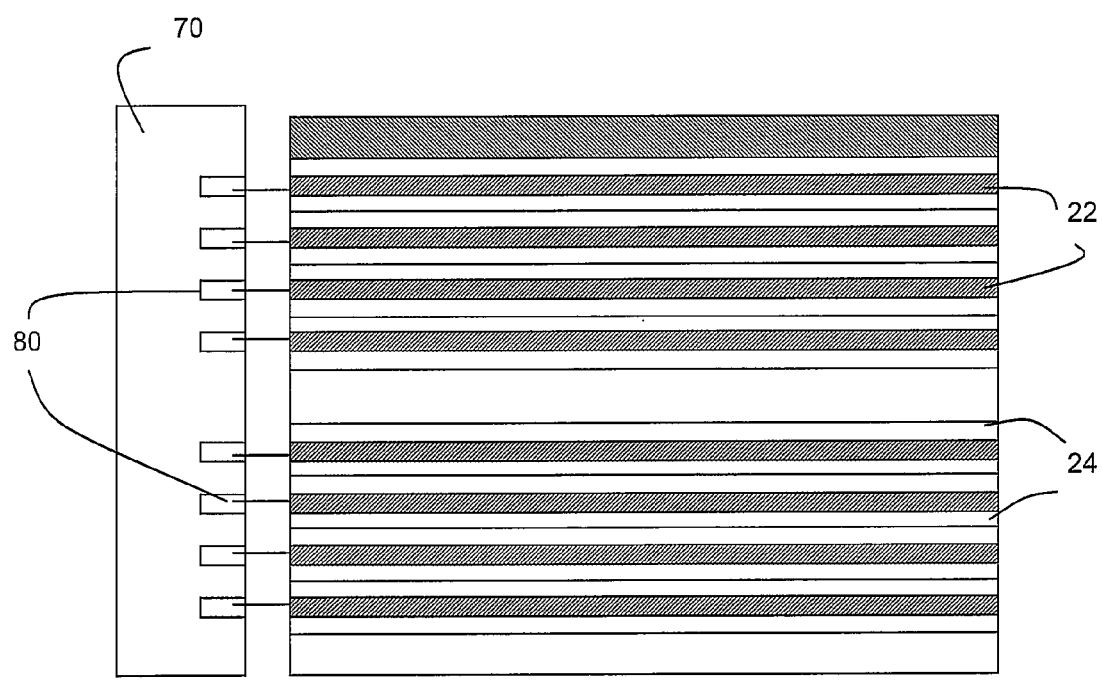
FIG. 12 illustrates schematically a third embodiment of the invention.

An alternative embodiment of the invention is illustrated in FIG. 12. In this case, the n-wells 22 and p-wells 24 are continuous over the row, and not broken at the split cells. In this case, bias circuits 80 are provided at the end of the rows to bias the rows; the n-wells are therefore biased at the row level, not the word level as in the arrangement of FIGS. 8 and 9. The biasing of the n-wells and p-wells is achieved in the central block 70 and not at the level of individual words. There is no need to route the three voltage rails over all block select cells, thus minimising the area overhead of back biasing.

In this case, both the n-wells are p-wells are biased in groups corresponding to one or two rows of the matrix. No attempt is made to individually bias individual transistors.

Note that the invention can be used with either local n-well or local p-well biasing, and the n-wells and p-wells can be exchanged in the above embodiments with suitable layout changes in the individual cells.

In particular, the use of triple-well technology may allow p-wells to be biased locally and the n-wells be connected together. More conventional technology may use a p-type substrate and individual n-wells, hence with global biasing of the p-wells and local biasing of the n-wells.

Figure 13:
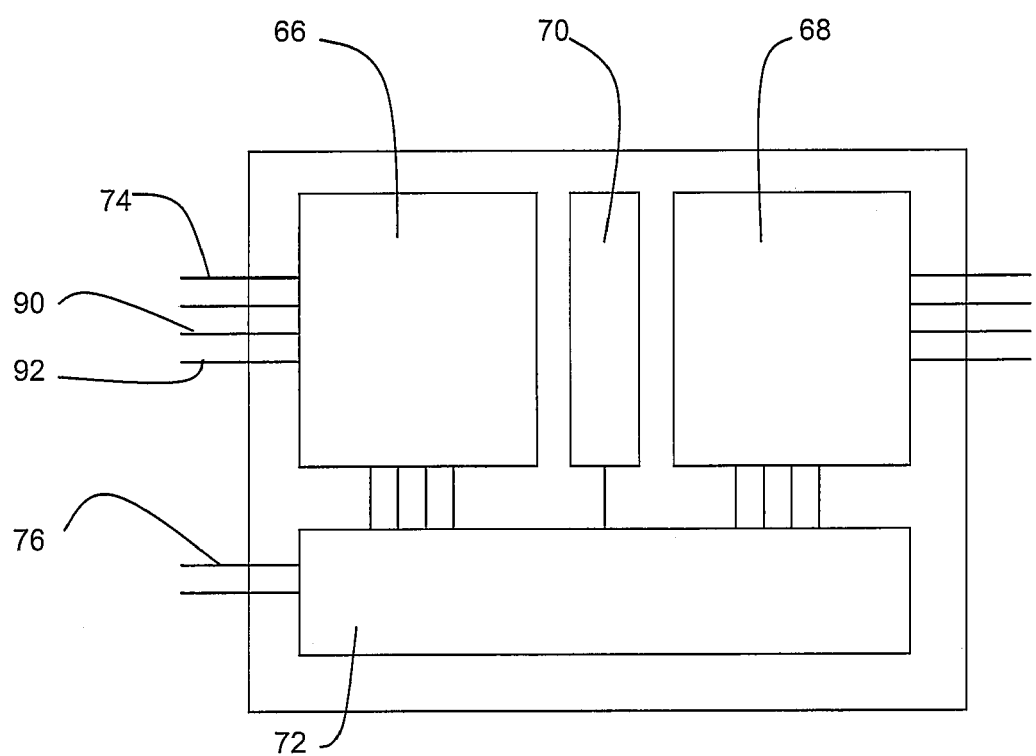
FIG. 13 illustrates schematically a fourth embodiment of the invention.

A further development is illustrated in FIG. 13. This shows an array very similar to that of FIG. 10 except that there are only four voltage lines entering each block, namely the positive and negative power supplies, an n-well bias line 90 and a p-well bias line 92. The array is implemented using a triple well technology as in FIG. 11 in which each block has a single n-well 22 and a plurality of p-wells 24.

The n-well bias line is simply connected to the n-well and hence to the whole device and the p-well bias line is connected individually to the individual p-wells 24. In this way, layout space is saved over an arrangement with individual n-wells and p-wells since it is not necessary to route separate supplies to both the n-wells and the p-wells for biasing. Instead, only the p-wells need separate supplies.

The n-well bias line 90 thus constitutes n-well bias means for the device as a whole and the p-well bias line 92 p-well bias means controls the bias at the level of the individual blocks 66,68. Other possible means of biasing include local power supplies, local, global or common power supply rails with integral switches, or any other means known to those skilled in the art.

Figure 14:
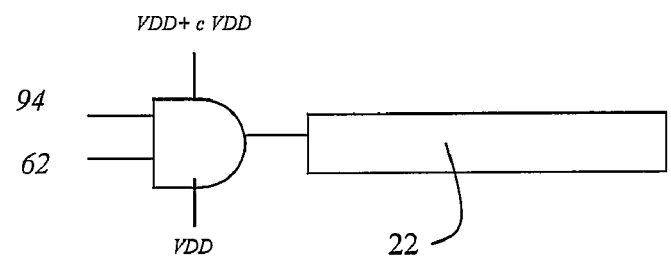
FIG. 14 illustrates schematically suitable n-well biasing logic for use with the embodiments of the invention.
Figure 14:
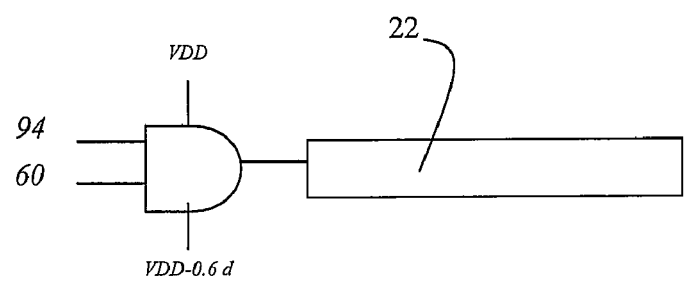
Figure 15:
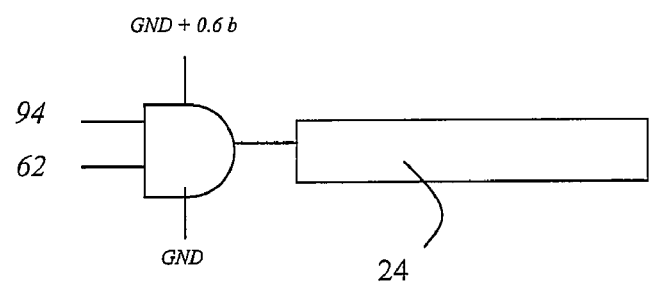
FIG. 15 illustrates schematically suitable p-well biasing logic for use with the embodiments of the invention.
Figure 15:
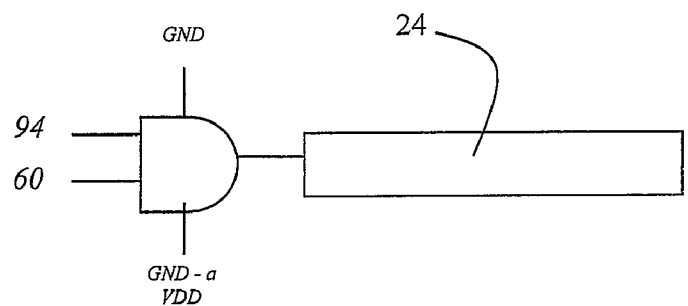

Depending on whether n-well biasing or p-well biasing, or both is required, one or both of the circuits of FIGS. 14 and 15 can be used to enable the biasing to be selected automatically.

FIG. 14 illustrates read and write circuits for local n-well biasing.

FIG. 15 illustrates read and write circuits for local p-well biasing.

A word select signal on word select line 94 combines with a read enable signal on read enable signal line 60 or a write enable signal on write enable signal line 62. The values of a, b, c and d are as above.

The circuits of FIGS. 14 and 15 can be included in the embodiments of FIGS. 8 to 13. Note that where the circuits are being applied to bias the whole row, for example in the embodiment of FIG. 11, the "word select" signal should be considered to be the OR-function of the word-select signal for all words in the row.

Further, note that the circuits of FIGS. 14 and 15 may need to be operated from power supplies with a higher voltage than $V_{DD}$, as illustrated in the Figures. This enables them to correctly power the wells 22, 24 as required. Level converters may be used to achieve the required voltages.

A further point is that the word-select signal used may be slightly in advance of (that is to say earlier) than the word select signal used for reading or writing to enable the wells to be charged before reading and writing takes place.

In use, the circuit may be used for error correction.

Conventionally, error correction for memory circuits has been implemented in the form of additional bits, especially parity bits, which are used for correcting incorrect data stored in an array.

The semiconductor memory device according to the embodiments can alternatively (or additionally) use back-bias techniques for error correction.

Above, back-biasing is described to improve noise margins under process variation. However, memories can still operate incorrectly at low voltages.

Experiments have been carried out on a multi-voltage domain body biased 512 kB SRAM in 65 nm CMOS. The circuit is as illustrated in FIG. 10 above with a first block 66, a second block 68 and a central region 70 including x-decoders. Peripheral circuitry 72 is provided connecting to the decoders and the blocks. The first and second blocks work as separate voltage domains as does the peripheral circuitry, i.e. each block and the peripheral circuitry can be driven separately with a separate voltage VDD. VDDP will be used to indicate the voltage applied to the periphery and VDDM the voltage applied to the block in question. Bias voltages are applied to n-wells and p-wells; separate bias voltages are applied that in general are not the same as either VDDP or VDDM.

Experiments were performed sweeping the supply voltages and back biasing conditions. Results are presented in the range of bias voltage in the memory domains from 0.7V to 0.9V since above 0.9 V there were no bit failures. Separate biasing was applied to the n-wells and p-wells.

The experiments used two sequential reads when reading each bit to ensure that the bit did not flip during reading.

FIGS. 16 and 17 shows tables of cell functionality for read-1 operations. Similar results were obtained for read-0 operations. FIG. 16 is for VDDP=0.8V and VDDM=0.7V while FIG. 17 is for VDDP=0.8V and VDDM=0.8V. The results were categorized into a pass region with no bit fails, an almost pass region with 1 to 100 faults, an almost fail region with 100 to 1000 faults and a fail region with more than 1000 faults. Each table shows results for a pair of bias voltages VDDP and VDDM at different bias voltages. The bias voltages of the N well increase from left to right and the bias voltages of the p well increase from top to bottom in 0.1V steps.

Increasing errors occur with lower supply voltage, as expected. Severe forward biasing of the n-well serves to correct errors. Reverse biasing the p-wells beyond −0.4V lowers the read current so far that the periphery sense amplifier no longer identifies the state of the bit.

Write operations were also tested as illustrated in FIGS. 18 and 19. FIG. 19 is for VDDP=0.8V and VDDM=0.9V while FIG. 19 is for VDDP=0.8V and VDDM=1.0V. This displays write failures instead of read failures as in FIGS. 16 and 17.

Further experiments showed first that in this design large differences between VDDM and VDDP are not helpful—a 0.3V difference gives poor results. Forward biasing of the p-well is generally unhelpful. With the approach with supply voltage in periphery and memory similar, reverse biasing the n-well assists. A small excess of VDDP over VDDM allows easier cell flipping.

Experiments were then carried out with an industrial 25N March test algorithm as illustrated in FIG. 20, which shows test results carried out at VDDP=VDDM=0.8V. In the unbiased case, the n-well is at 0.8V and the p-well at 0V which gives 16297 errors. Conversely, with a pwell-bias of 0.5V and an nwell-bias of 0.5V, or similar values, no errors at all are provided.

Thus, adjusting the bias voltages has the potential for eliminating a large number of errors, especially at low voltages.

Similar experiments are illustrated in FIG. 21 which shows a similar correction for VDDP=1.2V and VDDM=0.8V. Again, by selecting suitable bias voltages for the n and p wells, the number of errors is reduced to zero.

Thus, by applying suitable bias voltages, the errors can be reduced.

Thus, the inventors have realised that by back-biasing it is possible to reduce or correct errors that would otherwise be present. Instead of simply using back-biasing to remove effects of process variation, the present invention uses back-biasing to allow memories to operate correctly even with successful fabrication at low voltage operation.

In this way, small cells can be used with no need to use larger cells than the minimum to enhance noise margins. This is particularly useful at low supply voltages.

The approach described also reduces the requirement for parity bits to correct errors; the number of parity bits can be reduced or even eliminated.

The extent of improvement achieved—reduction of errors from 16000 to 0—is surprising and demonstrates the utility of the technique.

The embodiments described are purely schematic, and those skilled in the art will realise that many changes may be made. In particular, different voltages may be used where the properties of the devices used require them.

Further, the n-type and p-type regions may be exchanged in any embodiment, so any n-type device becomes a p-type device and vice versa.

Note that although the back biasing is described above with reference to FIGS. 16 to 21 when the back biasing arrangements of FIGS. 1 to 15 are used, the method of error reduction described with reference to FIGS. 16 to 21 may be used with alternative back biasing arrangements where these are available.

The invention claimed is:
1. A semiconductor memory device, comprising:
an array of memory cell elements arranged in rows and columns;
each memory cell element being formed using at least one well of a first conductivity type, either an n-well or a p-well, and at least one well of the opposite second conductivity type, a p-well or an n-well;
wherein the wells of first conductivity type are electrically connected together, and
wherein the wells of second conductivity type are divided into a plurality of groups, each corresponding to a respective group of memory cell elements, the wells of second conductivity type of each group being electrically connected together and electrically insulated from wells of other groups, wherein the wells of second conductivity type of each group are selectably connected to at least one input power supply for back biasing the wells of second conductivity type of all memory cell elements of the group in common.

2. A semiconductor memory device according to claim 1, wherein the wells of first conductivity type are connected to an input power supply for back biasing the wells of first conductivity type of all memory cell elements in the array in common.

3. A semiconductor memory device according to claim 1, further comprising a read-enable signal line, and a switch means connected to the read-enable signal line to respond to a read-enable signal to bias the p-well with a negative read voltage and/or the n-well with a positive read voltage.

4. A semiconductor memory device according to claim 3, wherein the negative read voltage is in the range (GND−a $V_{DD}$), where 0<a≦2, the positive read voltage is ($V_{DD}$−b $V_{DD}$) where 0<b≦1, and the power supply voltage is $V_{DD}$.

5. A semiconductor memory device according to claim 1, further comprising a write-enable signal line, and a switch means connected to the write-enable signal line to respond to a write-enable signal to bias the p-well with a first positive write voltage and/or the n-well with a second positive write voltage higher than the first positive write voltage.

6. A semiconductor memory device according to claim 5, wherein the first positive write voltage is in the range (GND+b $V_{DD}$) where 0<b≦1, the second positive write voltage is in the range ($V_{DD}$+a $V_{DD}$) where a is in the range 0<a≦2, and the power supply voltage is $V_{DD}$.

7. A semiconductor memory device according to claim 1, further comprising:
a peripheral block;
at least one memory power supply means for supplying power to at least one block of the memory, the or each block including an array of the memory cell elements;
a periphery power supply means for supplying power to the periphery,
wherein the memory power supply means supplies power at a first voltage or plurality of voltages and the periphery power supply means supplies power at an independent second voltage or plurality of voltages.

8. A semiconductor memory device according to claim 1, further comprising a plurality of memory blocks, each having a respective memory cell array, further comprising a respective memory power supply means for each block of the memory.

9. A semiconductor memory device according to claim 7 wherein the or each memory power supply means is arranged to selectably supply a retention voltage lower than the first voltage for operating the memory in a lower voltage retention mode.

10. A semiconductor memory device according to claim 1, wherein each row is divided into a plurality of words each containing a plurality of bits, and wherein the group of memory cell elements selected by the means for selectably biasing is divided in the row direction into complete words.

11. A semiconductor memory device according to claim 10, wherein each word includes a block select cell, and wherein a plurality of voltage lines extend in the column direction over the block select cells, the block select cells including means for selectably biasing the wells of second conductivity type by connecting a selected one of the voltage lines to the wells of second conductivity type.

12. A semiconductor memory device, comprising:
an array of memory cell elements -arranged in rows and columns:
each memory cell element being formed using at least one well of a first conductivity type, either an n-well or a p-well, and at least one well of the opposite second conductivity type, a p-well or an n-well:
wherein the wells of first conductivity type are electrically connected together, and
wherein the wells of second conductivity type are divided into a plurality of groups, each corresponding to a respective group of memory cell elements, the wells of second conductivity type of each group being electrically connected together and electrically insulated from wells of other groups, wherein the wells of second conductivity type of each group are selectable connected to at least one input power supply for back biasing the wells of second conductivity type of all memory cell elements of the group in common;
a read-enable signal line. and a switch means connected to the read-enable signal line to respond to a read-enable signal, at least in one of the following ways: biasing the p-well with a negative read voltage, biasing the n-well with a positive read voltage:
a write-enable signal line, and a switch means connected to the write-enable signal line to respond to a write-enable signal, at least in one of the following ways: biasing the p-well with a first positive write voltage, biasing the n-well with a second positive write voltage higher than the first positive write voltage; and
wherein the negative read voltage is in the range −1.5V to −0.9V, the positive read voltage is in the range 0.3V to 0.9V, and the power supply voltage is in the range 0.4V to 1.0V; and
wherein the first positive write voltage is in the range 0.3V to 0.9V, the second positive write voltage is in the range 1.8V to 3.0V and the power supply voltage is in the range 0.4V to 1.0V.

13. A semiconductor memory device, comprising:
an array of memory cell elements arranged in rows and columns;
each memory cell element being formed with at least one well of a first conductivity type and at least one well of an opposite second conductivity type;
first well biasing means connected to the wells of first conductivity type; and
second well biasing means connected individually to the groups of wells of second conductivity type;
wherein the wells of first conductivity type of the array are electrically connected together, and
wherein the wells of second conductivity type of the array are divided into a plurality of groups, each corresponding to a respective group of memory cell elements.

14. A method of operation of a memory device having an array of memory cell elements arranged in rows and columns with n-wells and p-wells, the method comprising:
operating the memory device with a memory drive voltage (VDDM) at which the number of bit errors is non-zero in a state in which the n-wells and p-wells are not biased; and
biasing the n-wells and the p-wells to reduce the number of bit errors.

15. A method of operation of a memory device according to claim 14, wherein the memory device further includes a periphery around the memory cell elements, the method further including driving the periphery with a periphery drive voltage (VDDP) separately from the memory drive voltage.

16. A method of operation of a memory device according to claim 14 wherein a forward bias is applied to the p-well and a reverse bias is applied to the n-well.

17. A method of operation of a memory device according to claim 16 wherein the memory drive voltage is in the range 0.6V to 0.8V, the p-well is forward biased to be 0.1V to 0.6V and the n-well is reverse biased with respect to the memory drive voltage to 0.3V to 0.6V.

18. A method of operation of a memory device according to claim 14 wherein a reverse bias is applied to the p-well and a forward bias is applied to the n-well.

* * * * *